(12) United States Patent
Fujiishi et al.

(10) Patent No.: US 6,828,636 B2
(45) Date of Patent: Dec. 7, 2004

(54) SEMICONDUCTOR DEVICE ISOLATED RESISTIVE ZONE

(75) Inventors: Yoshitaka Fujiishi, Hyogo (JP); Satoshi Kawasaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 365 days.

(21) Appl. No.: 10/134,426

(22) Filed: Apr. 30, 2002

(65) Prior Publication Data

US 2003/0080316 A1 May 1, 2003

(30) Foreign Application Priority Data

Oct. 30, 2001 (JP) ........................................ 2001-332553

(51) Int. Cl.[7] .............................................. H01L 27/04
(52) U.S. Cl. ..................................... 257/379; 257/506
(58) Field of Search .................................. 257/379, 506

(56) References Cited

U.S. PATENT DOCUMENTS 6,111,304 A * 8/2000 Sonoda ........................ 257/506
6,172,389 B1 * 1/2001 Sakoh ......................... 257/379

FOREIGN PATENT DOCUMENTS

| JP | 8-139271 | 5/1996 |
|---|---|---|
| JP | 2000-196019 | 7/2000 |

* cited by examiner

*Primary Examiner*—Gene M. Munson

(57) ABSTRACT

Excessive CMP (chemical mechanical polishing) of a resistive band region and margin deterioration in processing in a subsequent step are prevented, while a resistive zone is formed with an active region. In the semiconductor device, a source/drain impurity diffusion layer is used as the resistive zone. On a semiconductor substrate, the resistive band region to form the resistive zone, having at least a portion of a surface provided as the active region, is formed. In the resistive band region, the resistive zone is provided. A word line is arranged on the semiconductor substrate so as to surround the resistive zone. In the resistive band region, the area occupancy ratio of the active region per 10 $\mu m\square$ is set to be 40% or higher.

7 Claims, 11 Drawing Sheets

SEMICONDUCTOR DEVICE ISOLATED RESISTIVE ZONE

BACKGROUND OF THE INVENTION

1. Field of the Invention

The present invention relates to a semiconductor device in general, and more particularly to a semiconductor device obtained with an improved method of manufacturing a semiconductor device capable of preventing excessive CMP (chemical mechanical polishing) of a resistive band region and margin deterioration in processing in a subsequent step.

2. Description of the Background Art

A resistive zone is used for altering a potential of a circuit. As each interconnection comes to have lower resistance due to reduced size and increased speed, many recent devices use source/drain (S/D) as a resistive zone.

FIGS. 15 to 17 are plan views showing steps in a method of forming a resistive zone according to a conventional technique. FIGS. 18 to 25 are cross-sectional views showing a method of forming a resistive zone according to a conventional technique. FIGS. 18 to 24 show cross-sections viewed along the line XVIII—XVIII in FIG. 15.

FIG. 15 is a plan view showing active regions 2, 3 (to be provided as resistive zones) formed according to a conventional technique. FIG. 16 is a plan view showing a transfer gate (TG) 4 formed according to a conventional technique. FIG. 17 shows contact holes (CH) 5, 6, 9, 10, 12 formed according to a conventional technique. In these figures, reference numeral 1 represents a resistive band region; reference numeral 7 represents an active region in a densely-patterned portion; reference numeral 8 represents a TG in the densely-patterned portion; reference numeral 11 represents the densely-patterned portion; and reference numeral 31 represents an isolation oxide film region.

Detailed description will now be given.

Referring to FIG. 18, according to conventional STI (Shallow Trench Isolation) technique, an oxide film 14 and a nitride film 15 are formed on the surface of a silicon substrate 13, and active regions 2, 3 are patterned.

Referring to FIG. 19, in order to remove etching-induced damage in silicon substrate 13, the surface of a trench undergoes oxidization to form an oxide film 161. The oxidization also serves to round an upper corner and a lower corner of the trench. The widths of active regions 2, 3, however, are made narrower than in patterning since a sidewall of the trench is oxidized.

Referring to FIG. 20, an oxide film 16 fills the inside of the trench. $SiO_2$ film formed with HDP (High Density Plasma) is used as burying oxide film 16.

Thereafter, chemical mechanical polishing (CMP) is performed in order to remove oxide film 16 on nitride film 15. CMP is performed to be stopped at nitride film 15. It is difficult, however, to stop CMP at nitride film 15 because, in a resistive zone pattern as shown in FIG. 15, many regions are surrounded by an isolation oxide film 31. As a result, resistive band region 1 will be overpolished. Such overpolishing is more likely where the ratio of the area (area occupancy ratio) of a resistive zone (an active region) 2 relative to resistive band region 1 is lowered. In particular, when the area occupancy ratio of the active region per 10 $\mu m\square$ (herein representing 10 $\mu m \times 10 \mu m$; that is, a square having sides of 10 $\mu m$ long) is 20% or lower, overpolishing will occur significantly.

When overpolishing occurs, patterns surrounding resistive band region 1 will be damaged due to the overpolishing, as shown in FIG. 21. Related problems will be explained in the following.

In FIG. 22, nitride film 15 and oxide film 14 are removed after CMP. With the removal of nitride film 15 and oxide film 14, the surface of burying oxide film 16 will cave in and an upper corner 18 of the trench in active region 3 in the vicinity of the resistive zone is also exposed.

In FIG. 23, a gate oxide film (not shown) and a TG 17 are further formed, and then patterned.

Referring to FIG. 24, source/drain injection 19 is performed to form source/drain regions (not shown) of a transistor and a conductive portion 20 of resistive zone 2.

Referring to FIGS. 23 and 24, upper corner 18 of the trench will have top side and sidewall portions covered with TG 17. Accordingly, electric field concentration is likely in these portions and reverse narrow channel effect will occur. Consequently, a threshold voltage ($V_{th}$) of a transistor is made lower than a designed value.

A cross-sectional view along the line XXV—XXV in FIG. 17 corresponds to that along the line XXV—XXV in FIG. 25.

In FIG. 25, after forming source/drain regions, an interlayer oxide film 21 is formed and contact holes 22, 23 are opened according to a conventional technique. Here, in resistive band region 1, the height of burying oxide film 16 is lower than that of densely-patterned portion 11 which was not overpolished with CMP. In addition, as the area occupancy ratio of TG is low in resistive band region 1, there will be a level difference 24 with respect to densely-patterned portion 11 where the area occupancy ratio of TG is high. Level difference 24 results from excessive CMP and difference in the area occupancy ratio of TG. Level difference 24 causes photomechanical process of contact holes 22, 23 to be easily defocused. Deterioration of such photomechanical process margin will occur also in processing in a subsequent step. In addition, etching residue tends to be left in a subsequent etching step.

SUMMARY OF THE INVENTION

The present invention was made to solve the above-described problems. An object of the present invention is to provide an improved method of manufacturing a semiconductor device capable of preventing excessive CMP in a resistive region and forming a resistive zone with an active region.

Another object of the present invention is to provide an improved method of manufacturing a semiconductor device capable of preventing margin deterioration in processing and forming a resistive zone with an active region.

Another object of the present invention is to provide a semiconductor device obtained with such a method.

A semiconductor device according to a first aspect involves a semiconductor device using a source/drain impurity diffusion layer as a resistive zone. The device has a semiconductor substrate, on which a resistive band region to form the resistive zone, having at least a portion of the surface provided as an active region, is formed. The resistive zone is provided in the resistive band region. A word line is arranged on the semiconductor substrate so as to surround the resistive zone. In the resistive band region, the area occupancy ratio of the active region per 10 $\mu m \square$ is set to be 40% or higher.

A second aspect involves a semiconductor device using a source/drain impurity diffusion layer as a resistive zone. The device has a semiconductor substrate, on which a resistive band region to form the resistive zone, having at least a portion of a surface as an active region, is formed. In the resistive band region, a resistive zone surrounded by an isolation region is provided. A dummy active region is arranged in the isolation region.

A third aspect involves a semiconductor device using a source/drain impurity diffusion layer as a resistive zone. The device has a semiconductor substrate, on which a resistive band region to form the resistive zone, having at least a portion of a surface as an active region, is formed. In the resistive band region, a resistive zone surrounded by an isolation region is provided. A dummy word line is arranged in the isolation region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures.

(First Embodiment)

Figure 1:
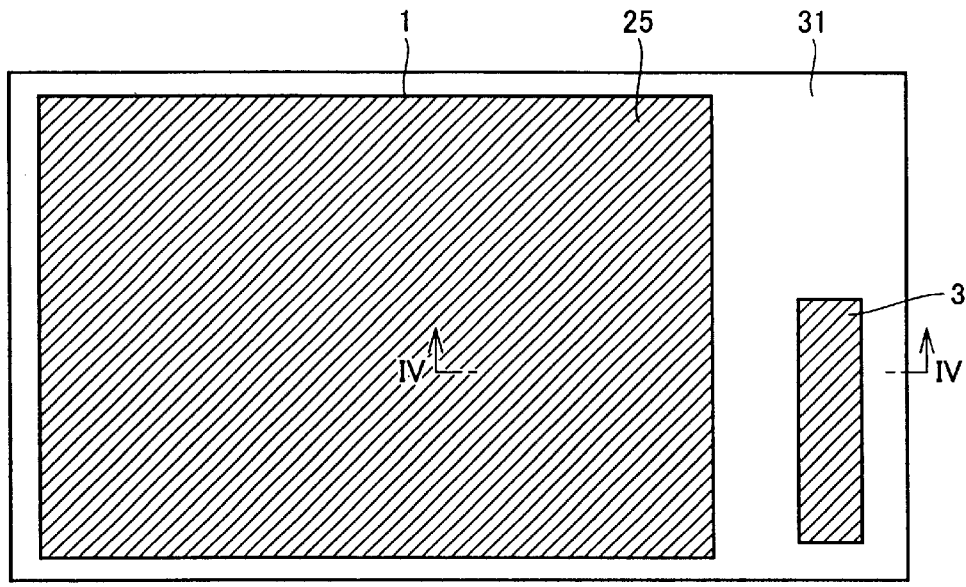
FIGS. 1 to 3 are plan views of a semiconductor device in first to third steps of a manufacturing method according to a first embodiment.
Figure 2:
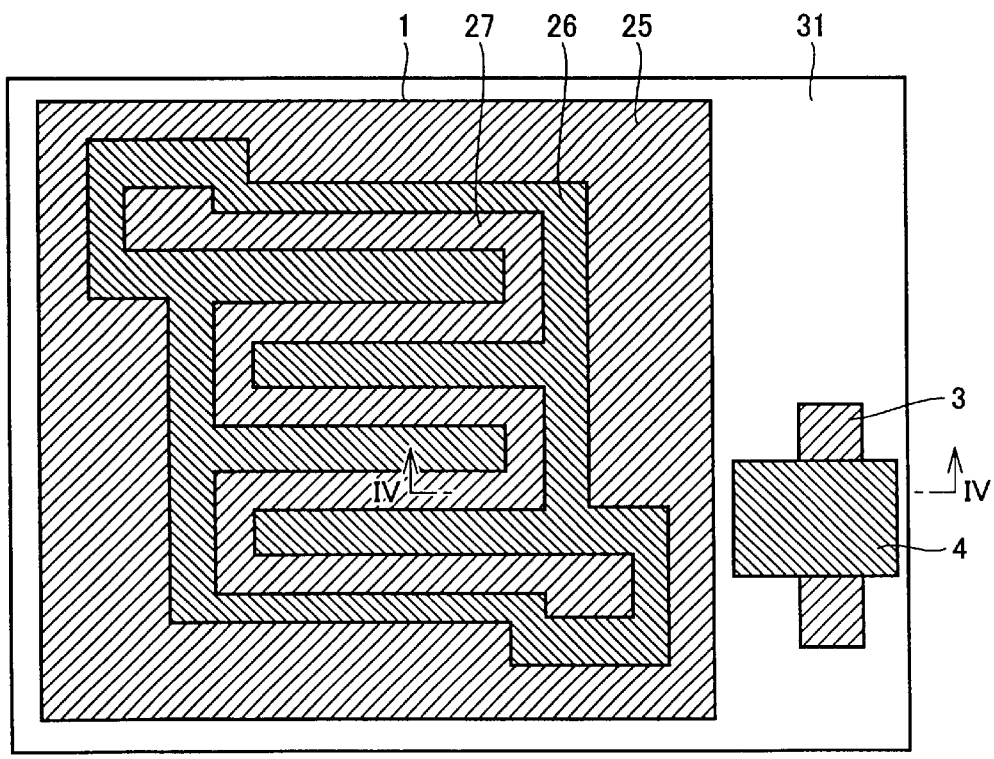
Figure 3:
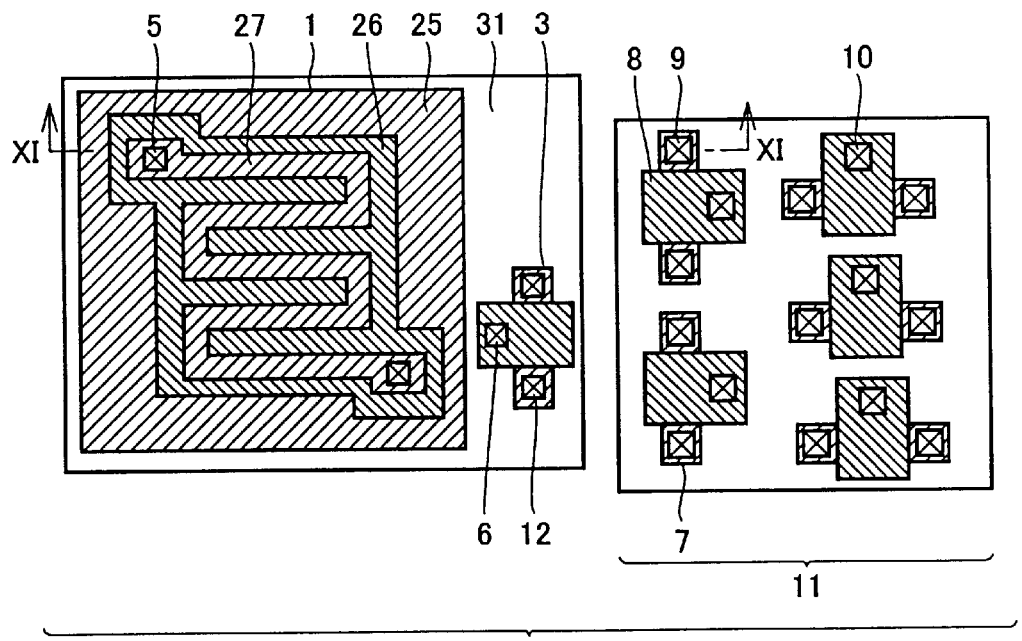

FIGS. 1 to 3 show in plan views steps of a method according to a first embodiment. FIGS. 4 to 11 show in cross-sectional views the method according to the first embodiment.

A cross-sectional view along the line IV—IV in FIGS. 1 and 2 corresponds to that along the line IV—IV in FIGS. 4 to 10.

Referring to FIG. 1, the whole surface of resistive band region 1 is provided as an active region 25. Referring to FIG. 2, a TG 26 is patterned so as to surround a resistive zone 27. In the figures, a region shown with reference numeral 31 represents an isolation oxide film region.

The above-mentioned steps will be described with reference to cross-sectional views.

Figure 4:
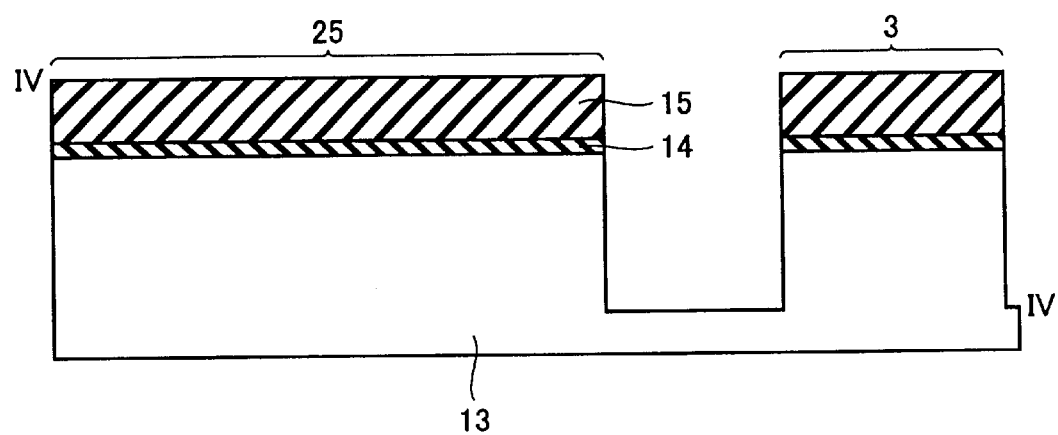
FIGS. 4 to 11 are cross-sectional views of a semiconductor device in first to eighth steps of a manufacturing method according to a first embodiment.
Figure 5:
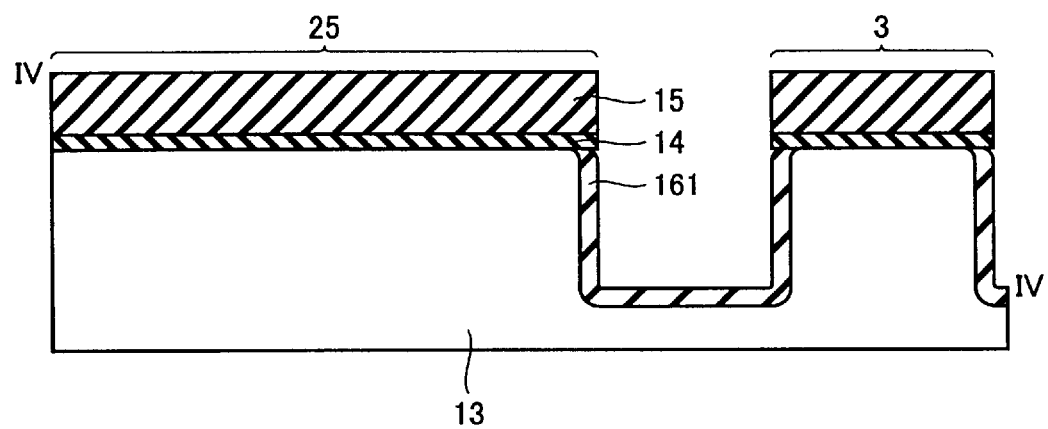

Referring to FIGS. 4 and 5, active regions 25, 3 are formed by patterning, in a similar manner as in the conventional example.

Referring to FIG. 5, in order to remove an etching-induced damage, an oxide film 161 is formed on a sidewall of a trench.

Figure 6:
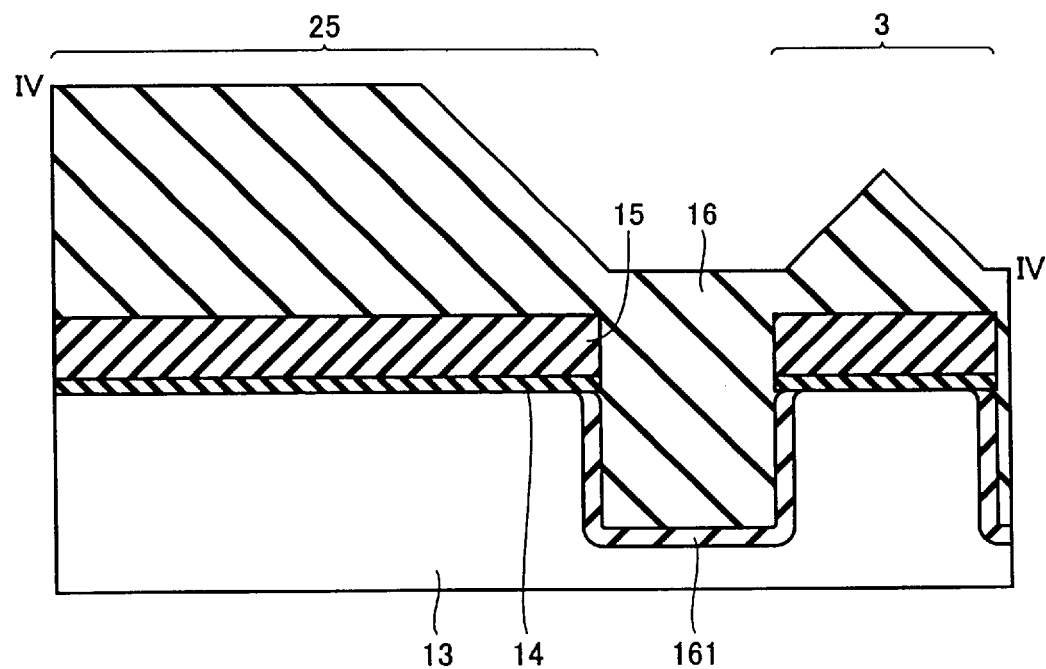

Referring to FIG. 6, a burying oxide film 16 is formed to fill the trench, in a similar manner as in the conventional example.

Figure 7:
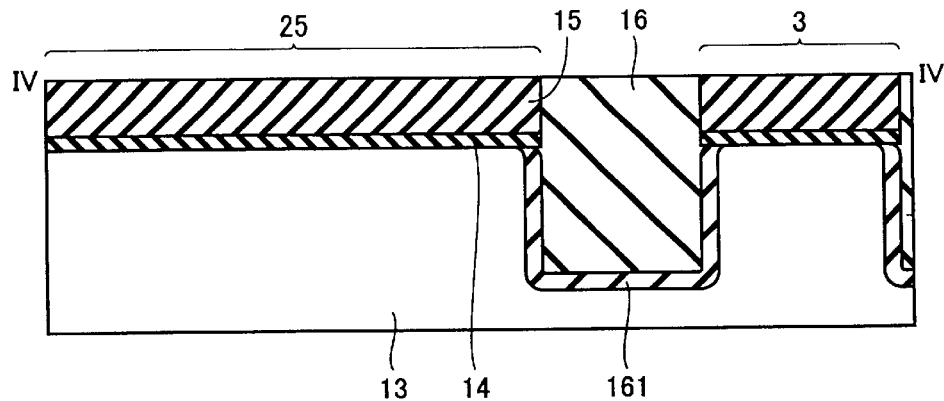

Referring to FIG. 7, CMP is performed in order to remove oxide film 16 on nitride film 15. Here, since the area of isolation oxide film region 31 is made smaller than in the conventional example, excessive CMP is less likely, and hence polishing can be stopped at nitride film 15. Here, the area occupancy ratio of active region 25 per 10 $\mu$m$\square$ is 100% because the whole surface is provided as an active region. In a resistive band region, when the area occupancy ratio of the active region per 10 $\mu$m$\square$ is 40% or higher, excessive CMP is quite unlikely.

Figure 8:
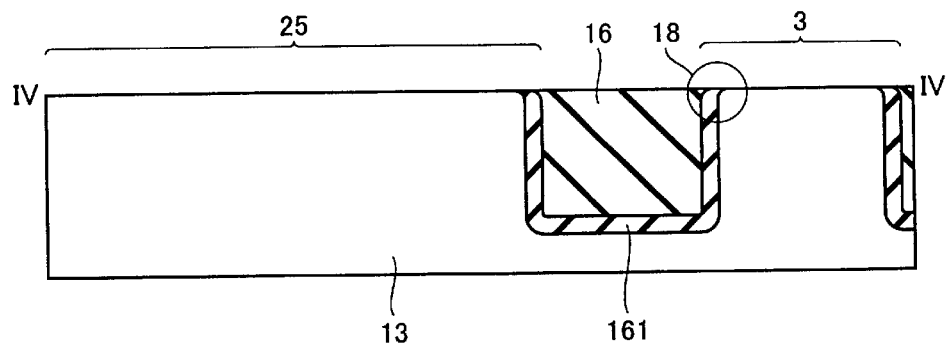

Referring to FIGS. 7 and 8, nitride film 15 and oxide film 14 are removed after CMP. According to the present embodiment, a "step" at an upper corner 18 of a trench as in a conventional example will not be produced.

Figure 9:
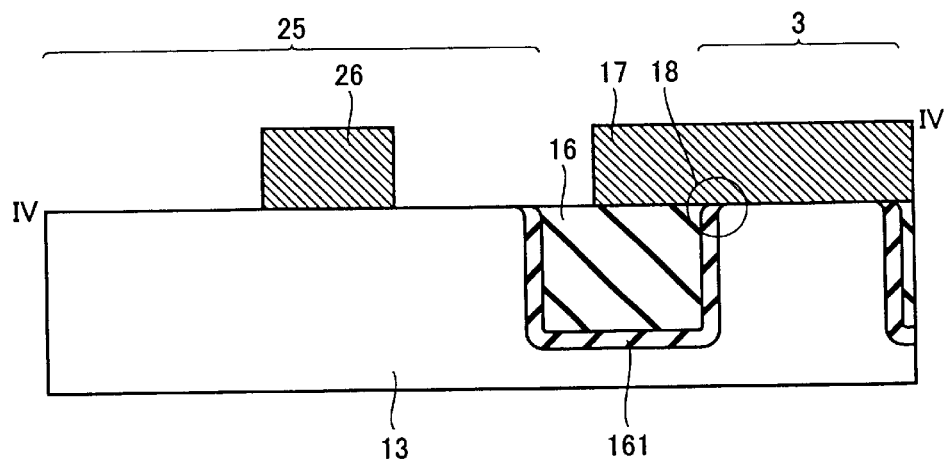

Referring to FIG. 9, a gate oxide film (not shown), TG 26 (a word line for forming a resistive zone) and TG 17 are formed on substrate 13 by patterning.

Figure 10:
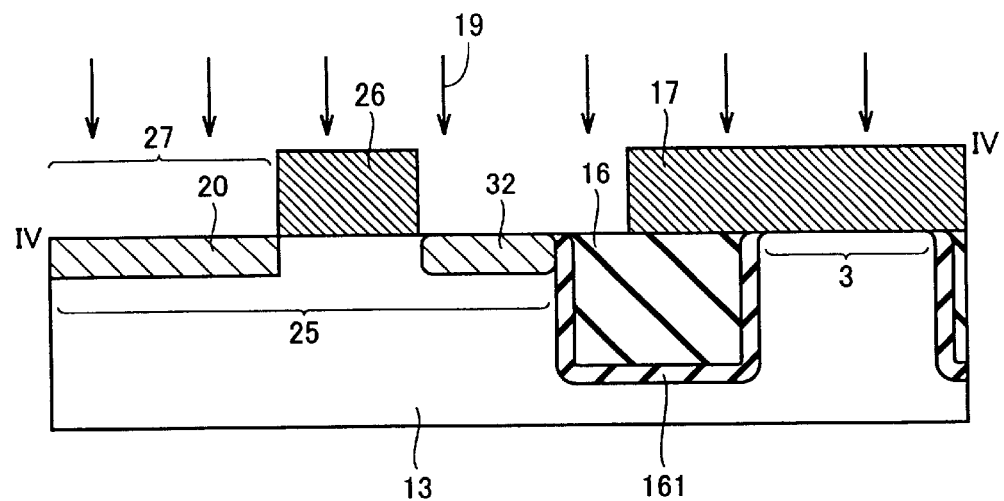
Figure 11:
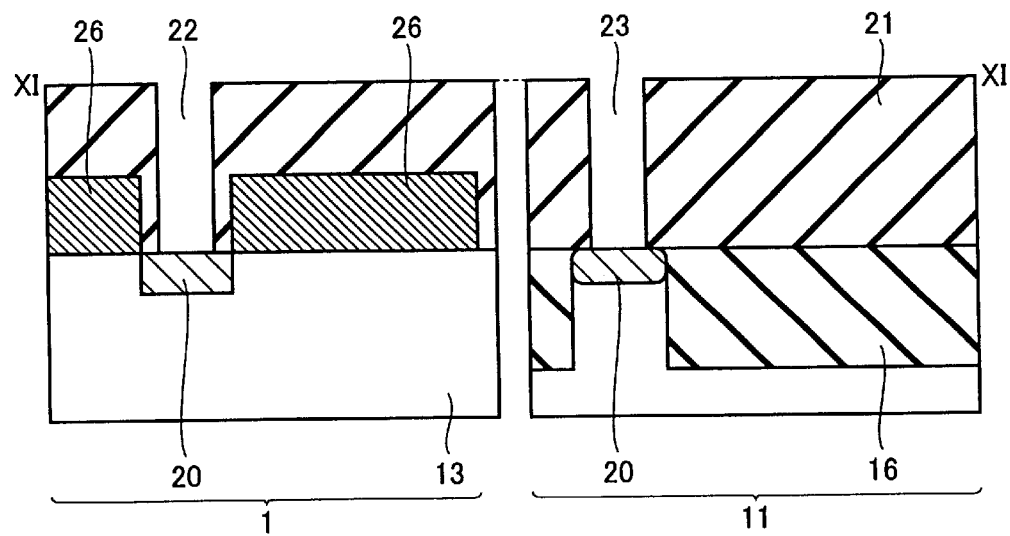

Referring to FIG. 10, ion injection 19 onto the surface of substrate 13 for forming source/drain regions is performed to form source/drain regions (not shown) of a transistor, a conductive portion 20 of resistive zone 27 and a source/drain injected portion 32. Conductive portion 20 is formed in a region surrounded by TG 26.

In a conventional example, as oxidization was performed to repair a damage caused by trench etching, the width of the resistive zone was narrow. In the present embodiment, however, TG 26 is simply patterned and formed as resistive zone 27. Therefore, resistive zone 27 can be formed exactly as designed.

Moreover, as a "step" is not produced at upper corner 18 of the trench, the sidewall will not be covered by TG 17 and reverse narrow channel effect can also be suppressed. Thus, the transistor can also be produced with a threshold voltage of the designed value. In addition, as resistive zone conductive portion 20, source/drain injected portion 32 and TG 26 structurally form a transistor, it is possible that resistive zone conductive portion 20 and source/drain injected portion 32 are undesirably connected if a potential of TG 26 is floating. In order to avoid the possibility, the potential of TG 26 has to be fixed. The fixed potential is desirably set to a voltage sufficiently lower than GND (0V) or the threshold voltage.

Referring to FIG. 3, contact holes 5, 6, 9, 10 are formed thereafter, to complete resistive zone 27. A cross-sectional view here along the line XI—XI corresponds that along the line XI—XI in FIG. 11.

In a conventional example, level difference was present between the resistive band region and densely-patterned portion 11. In the present embodiment, however, the level difference can be made smaller because of the presence of TG 26 in resistive zone 1. Thus, the process can be improved to suppress the deterioration as can be seen in the conventional example. Here, TG area occupancy ratio in the resistive band region is approximately 30 to 40%.

According to the present embodiment, excessive CMP in the resistive band region and margin deterioration in processing in a subsequent step can be prevented, and a resistive zone can be formed with an active region.

(Second Embodiment)

The second embodiment is a variation of the first embodiment.

Figure 12:
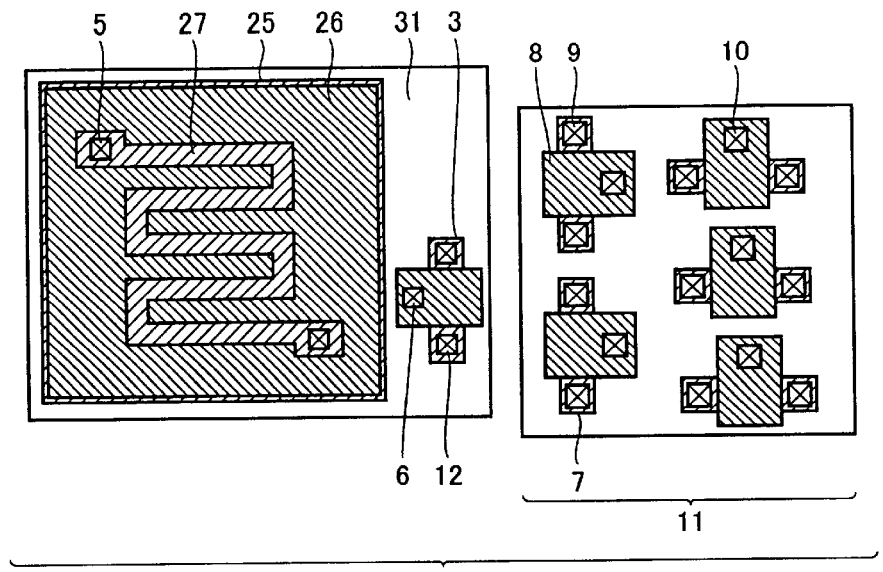
FIG. 12 is a plan view of a semiconductor device according to a second embodiment.

FIG. 12 is a plan view of a semiconductor device according to the second embodiment.

According to the present embodiment, a pattern of TG 26 surrounding resistive zone 27 is extended to the whole surface of the resistive band region, in addition to the surroundings of resistive zone 27. Thus, the same effect as in the first embodiment can be obtained, and moreover, the effect of reducing the level difference in a subsequent step will be more significant than in the first embodiment, because TG area occupancy ratio in the resistive band region will be improved compared with the first embodiment. Here, TG area occupancy ratio in the resistive band region can be raised to approximately 80%.

(Third Embodiment)

Figure 13:
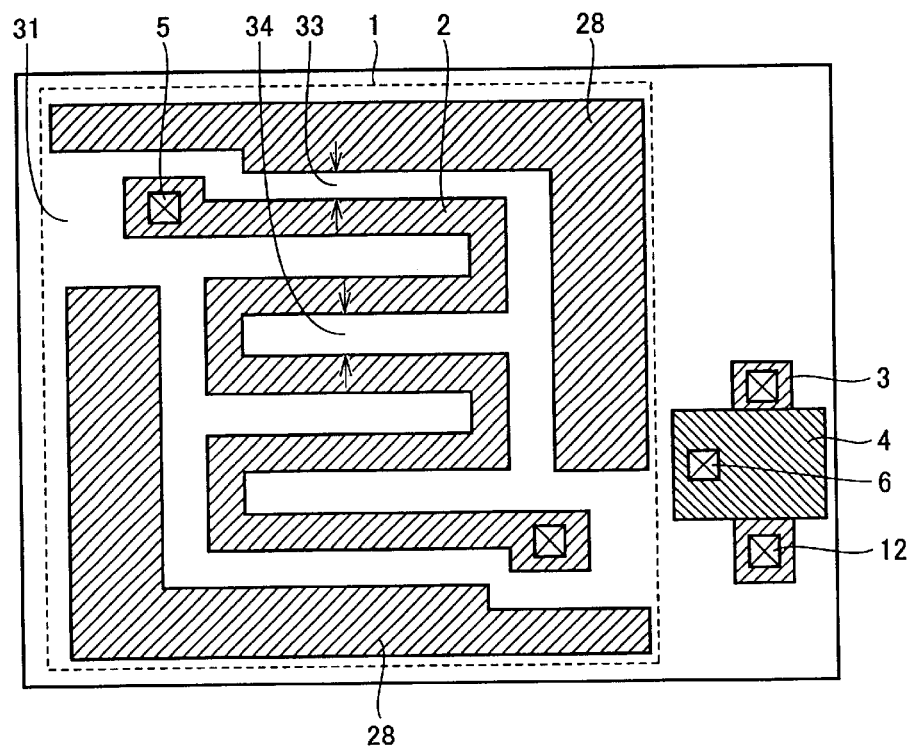
FIG. 13 is a plan view of a semiconductor device according to a third embodiment.

FIG. 13 is a plan view of a semiconductor device according to the third embodiment. Though a resistive zone 2 shown in FIG. 13 is provided in a similar layout as in a conventional example, a dummy active region 28 is provided in isolation region 31 of resistive band region 1. According to the present embodiment, the area occupancy ratio of the active region in the resistive band region is improved compared with the conventional example. Therefore, excessive CMP and reverse narrow channel effect can be suppressed. Here, the area occupancy ratio of the active region is approximately 40% because a dummy active region—resistive zone margin 33 requires a dimension comparable to an isolation width 34 between resistive zones. In addition, the level difference in the subsequent step can be made smaller by the amount that excessive CMP is suppressed.

(Fourth Embodiment)

Figure 14:
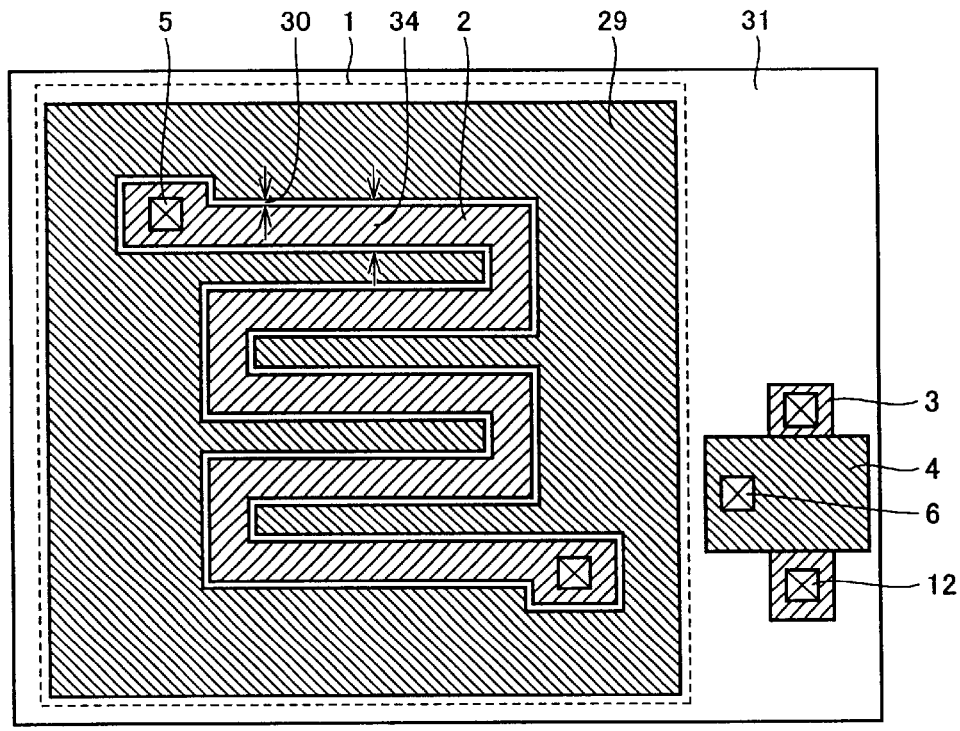
FIG. 14 is a plan view of a semiconductor device according to a fourth embodiment.
Figure 15:
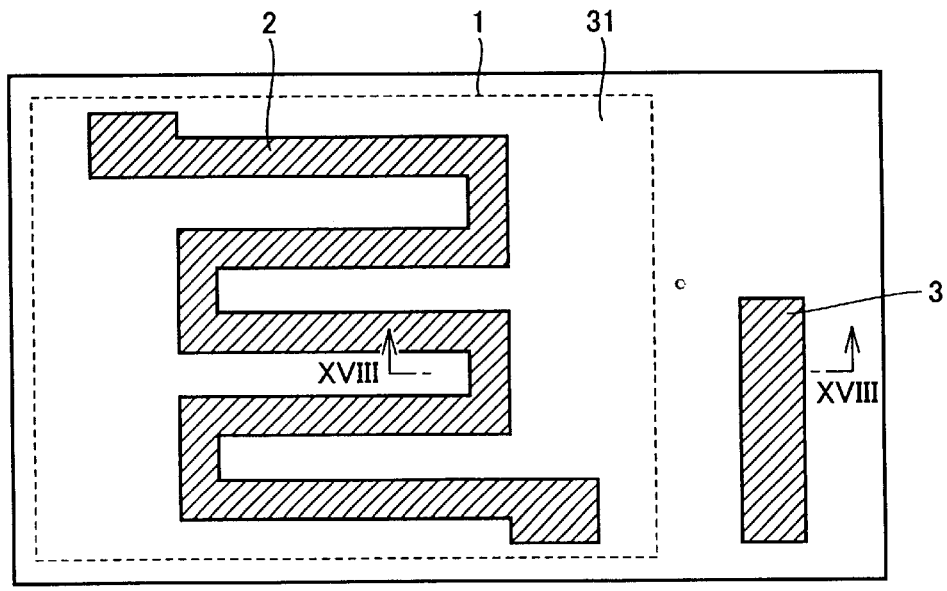
FIGS. 15 to 17 are plan views of a semiconductor device in first to third steps of a conventional manufacturing method.
Figure 16:
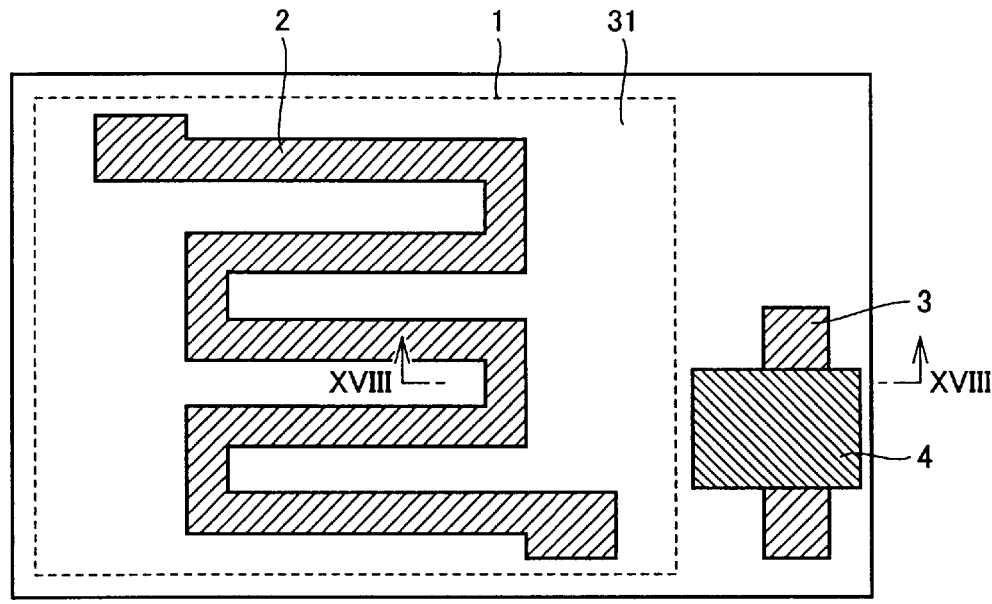
Figure 17:
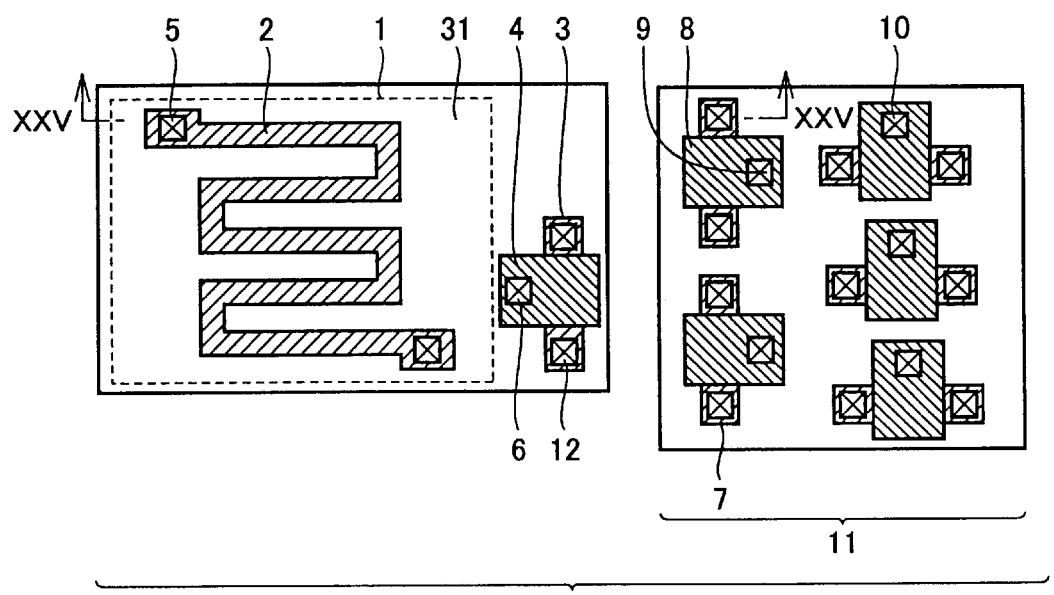
Figure 18:
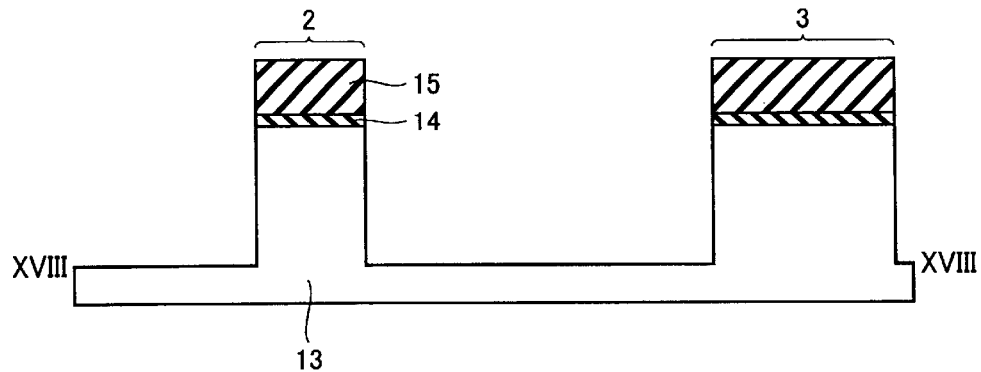
FIGS. 18 to 25 are cross-sectional views of a semiconductor device in first to eighth steps of a conventional manufacturing method.
Figure 19:
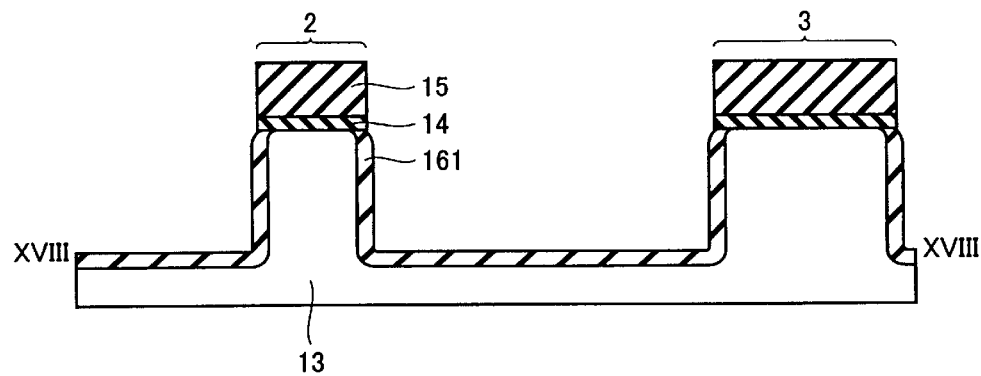
Figure 20:
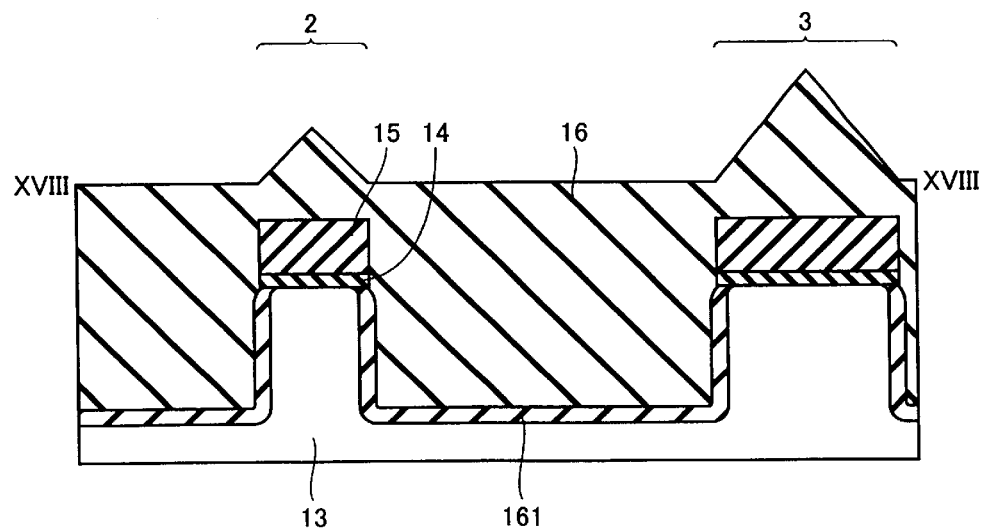
Figure 21:
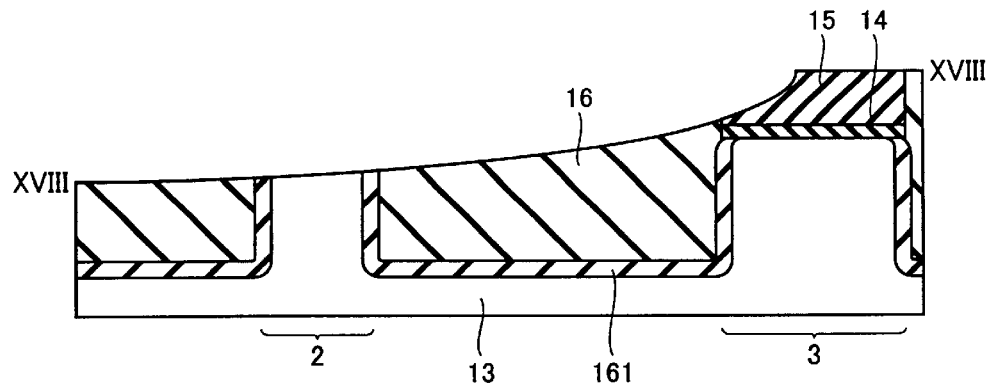
Figure 22:
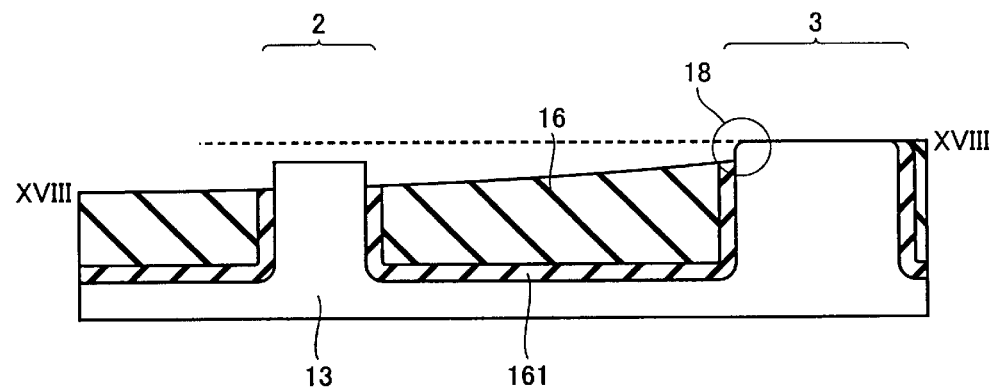
Figure 23:
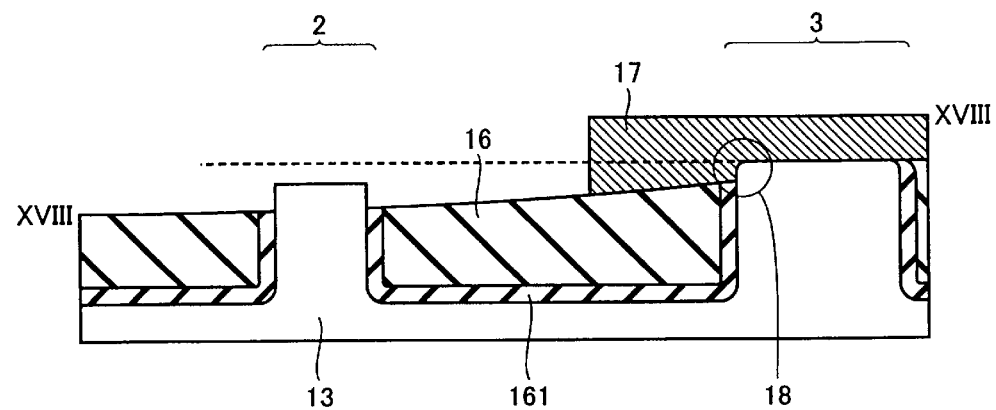
Figure 24:
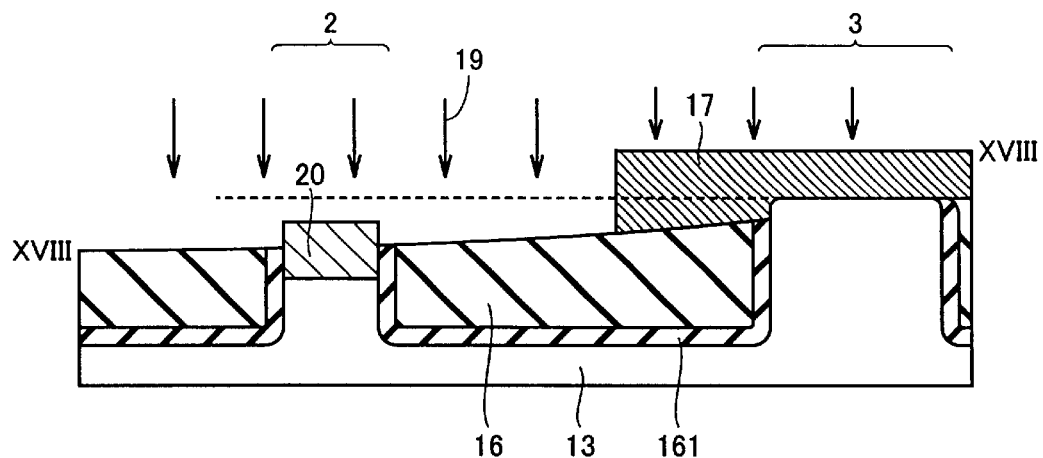
Figure 25:
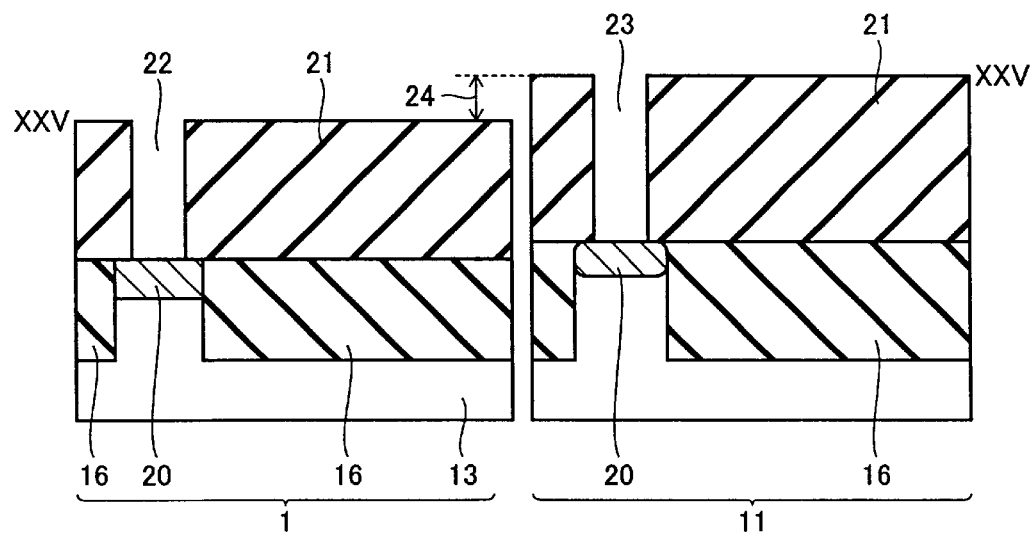

The fourth embodiment is a variation of the third embodiment. Referring to FIG. 14, though a resistive zone 2 is provided in a similar layout as in a conventional example, a dummy TG 29 is provided on isolation region 31 of resistive band region 1. According to the present embodiment, since TG area occupancy ratio in the resistive band region 1 is improved compared with the conventional example, level difference in a subsequent step can be made smaller. Here, a dummy TG 29—resistive zone margin 30, depending on registration accuracy level of photomechanical process, can be narrowed to approximately 0.1 μm, and dummy TG 29 can be arranged also in isolation width 34 between resistive zones. Thus, TG area occupancy ratio of the resistive band region can be raised to approximately 70%.

(Fifth Embodiment)

The present embodiment is a further variation of the third embodiment. The present invention is a combination of the third and fourth embodiments. Though not shown, a resistive zone is provided in a similar layout as in a conventional example, and both a dummy active region and a dummy TG are arranged on the isolation region of the resistive band region. Thus, effects from both third and fourth embodiments will be obtained.

In the above embodiments, a resistive zone may be of either N-type or P-type.

In the above embodiments, the same reference characters refer to the same or corresponding components in the figures.

As described above, the present invention can prevent excessive CMP, and is effective in reducing level difference in a subsequent step.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device using a source/drain impurity diffusion layer as a resistive zone, comprising:
   a semiconductor substrate;
   a resistive band region to form said resistive zone, formed on said semiconductor substrate and having at least a portion of a surface provided as an active region;
   an resistive zone provided in said resistive band region; and
   a word line arranged on said semiconductor substrate to surround said resistive zone; wherein
      in said resistive band region, an area occupancy ratio per 10 μm☐ of said active region is set to at least 40%.

2. The semiconductor device according to claim 1, wherein
   said resistive band region includes a smallest rectangular area being able to surround two-dimensionally said resistive zone and said word line of the semiconductor device.

3. The semiconductor device according to claim 1, wherein
   said active region has the area occupancy ratio of 100%.

4. The semiconductor device according to claim 3, wherein
   said word line is arranged on a whole surface of said resistive band region in addition to surroundings of said resistive zone.

5. A semiconductor device using a source/drain impurity diffusion layer as a resistive zone, comprising:
   a semiconductor substrate;
   a resistive band region to form said resistive zone, formed on said semiconductor substrate and having at least a portion of a surface provided as an active region;
   a resistive zone provided in said resistive band region and surrounded by an isolation region; and
   a dummy active region arranged in said isolation region.

6. The semiconductor device according to claim 5, further comprising a dummy word line arranged in said isolation region.

7. A semiconductor device using a source/drain impurity diffusion layer as a resistive zone, comprising:
   a semiconductor substrate;
   a resistive band region to form said resistive zone, formed on said semiconductor substrate and having at least a portion of a surface provided as an active region;
   a resistive zone provided in said resistive band region and surrounded by an isolation region; and
   a dummy word line arranged in said isolation region.

* * * * *